United States Patent [19]
Ibrahim et al.

[11] 4,417,392
[45] Nov. 29, 1983

[54] PROCESS OF MAKING MULTI-LAYER CERAMIC PACKAGE

[75] Inventors: Shawki S. Ibrahim; James E. Elsner, both of Lafayette, Ind.

[73] Assignee: CTS Corporation, Elkhart, Ind.

[21] Appl. No.: 312,729

[22] Filed: Oct. 19, 1981

Related U.S. Application Data

[62] Division of Ser. No. 149,968, May 15, 1980, Pat. No. 4,320,438.

[51] Int. Cl.³ .............................................. H05K 3/34
[52] U.S. Cl. ..................................... 29/840; 29/830; 357/69
[58] Field of Search ......................... 174/52 FP, 68.5; 357/69, 70, 75, 80; 361/401, 406; 29/840, 830, 832

[56] References Cited

U.S. PATENT DOCUMENTS

| 3,435,516 | 4/1969 | Kilby | 174/52 FP X |
| 3,436,604 | 4/1969 | Hyltin et al. | 361/401 X |
| 3,626,259 | 12/1971 | Garboushian et al. | 174/52 FP X |
| 3,651,434 | 3/1972 | McGeough et al. | 361/401 X |
| 3,676,748 | 7/1972 | Kobayashi et al. | 361/406 X |
| 3,828,228 | 8/1974 | Wong et al. | 174/52 FP X |

FOREIGN PATENT DOCUMENTS 55-24479 2/1980 Japan ..................................... 357/69

Primary Examiner—Howard N. Goldberg
Assistant Examiner—Carl J. Arbes
Attorney, Agent, or Firm—Larry J. Palguta; John A. Young

[57] ABSTRACT

In a multi-layer ceramic package, a plurality of ceramic lamina each has a conductive pattern, and there is an internal cavity of the package within which is bonded a chip or a plurality of chips interconnected to form a chip array. The chip or chip array is connected through short wire bonds at varying lamina levels to metalized conductive patterns thereon, each lamina level having a particular conductive pattern. The conductive patterns on the respective lamina layers are interconnected either by tunneled through openings filled with metalized material, or by edge formed metalizations so that the conductive patterns ultimately connect to a number of pads at the undersurface of the ceramic package mounted onto a metalized board. There is achieved a high component density; but because connecting wire leads are "staggered" or connected at alternating points with wholly different package levels, it is possible to maintain a 10 mil spacing and 10 mil size of the wire bond lands. As a result, there is even greater component density but without interference of wire bonds one with the other, this factor of interference being the previous limiting factor in achieving high component density networks in a multi-layer ceramic package.

6 Claims, 6 Drawing Figures

PROCESS OF MAKING MULTI-LAYER CERAMIC PACKAGE

This is a divisional application Ser. No. 149,968 filed May 15, 1980 now U.S. Pat. No. 4,320,438 issued Mar. 16, 1982.

In "packaging" interconnected chip or chip arrays, wire bondings from the chip or chip array, particularly where there is a high component density, or where bonding pads on chips are closely spaced, are excessively crowded so that there is a real danger that the wire bonds will come into too close contact with each other and present a serious difficulty in maintaining required spacing for the wires and the bonding lands. This is because the conductive patterns converge upon the chips from the printed metalized patterns provided on the single ceramic lamina. The result is overcrowding of the wire conductor or bondings. However, the trend in multiple circuit chip structures, is toward even greater component density, and the conductive patterns on the ceramic package must be wire bonded to the chips of the array.

Thus, the technology trend, headed as it is toward even greater component density, presents serious and thus far unsolved problems of how to achieve the necessary pin outs, from LSI (large scale integrated) arrays though wire bondings to the metalized conductive patterns while still maintaining an industry imposed standard of 10 mil spacings for the pin out wire bonds.

SUMMARY OF THE INVENTION

It is a principal object of the present invention to provide a high component density, multi-layer chip carrier in which wire bonds are connected to a single chip or to chips interconnected in a chip array, with the wire bondings then disposed for pin-outs at alternately different layers in the ceramic package, thus achieving greater clearance for the respective wire bonds and wire bonding lands.

Another object of the present invention, is to provide an interconnected chip array disposed within a cavity of a multi-layer ceramic package, in which the wire bonds are successively secured between the chip array at one end and to different levels of a multi-layer ceramic package at the other end. The respective levels of the ceramic package are individually metalized for a particular conductive pattern, and the patterns are connected through either or both of metalized connections in the form of "tunneled through" openings from one layer to the other and edge metalizations so that the respective conductive patterns are connected, leading ultimately to a series of pads at the undersurface of the ceramic package.

Another object of the present invention, is to increase the density of an interconnected LSI chip array while at the same time providing the necessary pin outputs for wire bondings leading to such array and while maintaining the requisite 10 mil spacing and 10 mil width of metalized wire bonding lands.

An overall object of the present invention is to provide a multi-layer ceramic package having various level lamina each with a particular conductive pattern, the patterns on the respective layers being connected by either tunneled through or edge metalization bonding, or both. Various pin outs from a central disposed interconnected chip array, disposed within a cavity are connected through wire bonds with said patterns while maintaining an appropriate spacing one relative to the other.

Other objects and features of the present invention will become apparent from a consideration of the following description which proceeds with reference to the accompanying drawings in which selected example embodiments are illustrated by way of example, and not by way of limitation.

DRAWINGS

DETAILED DESCRIPTION OF THE INVENTION

Figure 1:
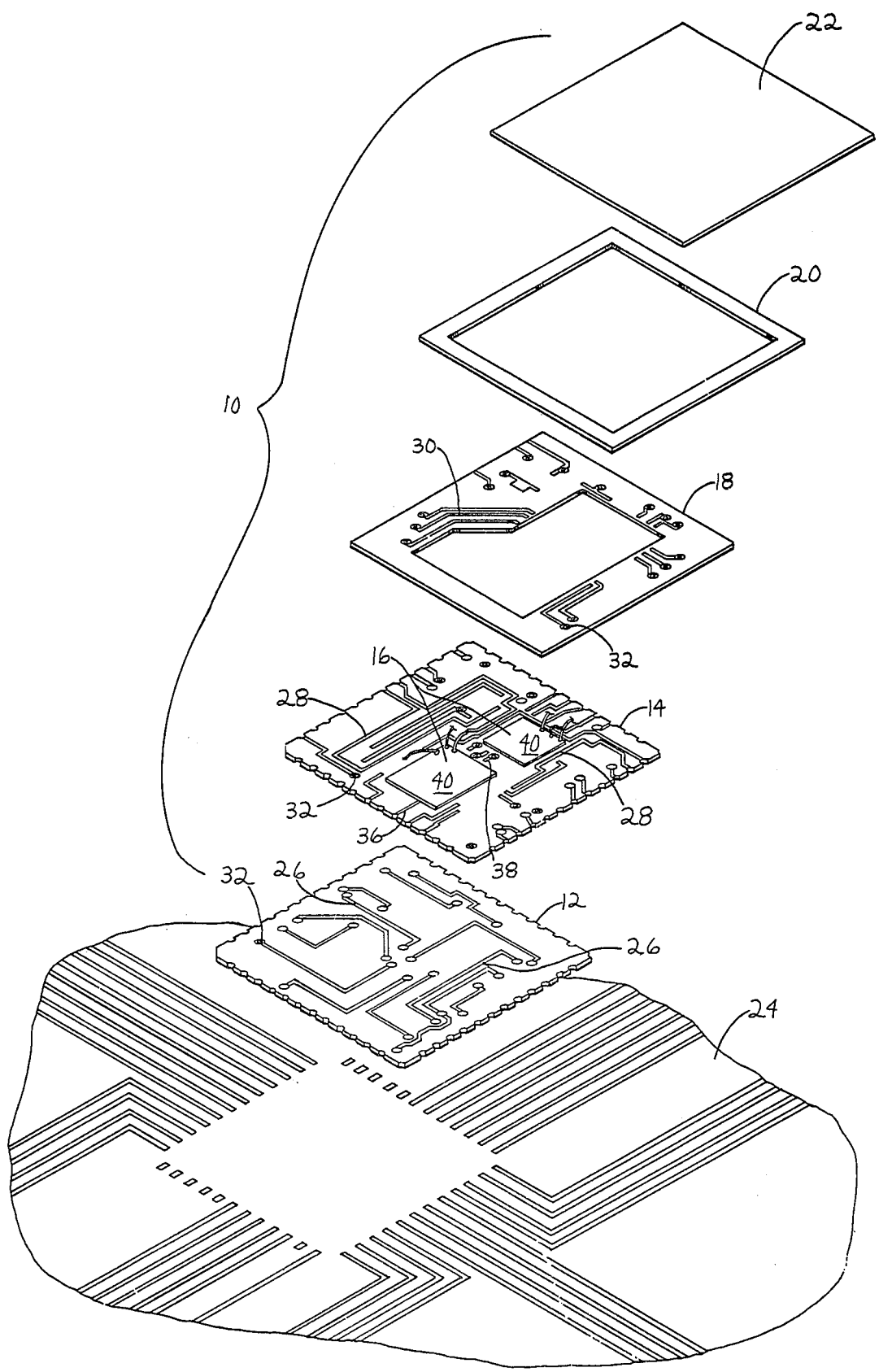
FIG. 1 is an isometric exploded view illustrating the multi-layer ceramic package, with a printed circuit board at the lower portion and a combination ring-and-cover at the upper end which seals an internal cavity in the ceramic package for receiving a chip array.

Referring to FIG. 1, a multi-layer ceramic package designated generally by reference numeral 10 includes multi-layers of ceramic substrate including a base layer 12, intermediate layer 14 on which is mounted an interconnected chip array 16, an upper frame layer 18, a ring layer 20, and a cover layer 22. The multi-layer ceramic package as a whole is mounted on a metalized board 24.

Figure 4:
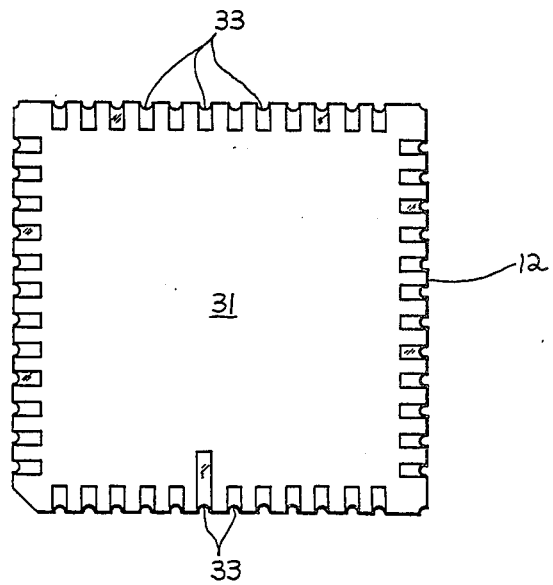
FIG. 4 is the undersurface of the base layer of the ceramic package to be mounted to the metalized board.

The base layer 12, intermediate layer 14, and frame layer 18 each has a printed conductive pattern illustrated by reference numeral 26 in the base layer 12, by reference numeral 28 in the intermediate layer, and by reference numeral 30 for the frame layer 18. The particular pattern of these conductive metalization paths is not a part of the present invention. However, it is contemplated that prior to assembly, the "green" or unfused ceramic substrates have formed thereon the conductive patterns which are then matched together and electrically connected through connections leading ultimately to pads 33 on the undersurface 31 (FIG. 4) of the base layer 12 for the metalized board 24.

Figure 3:
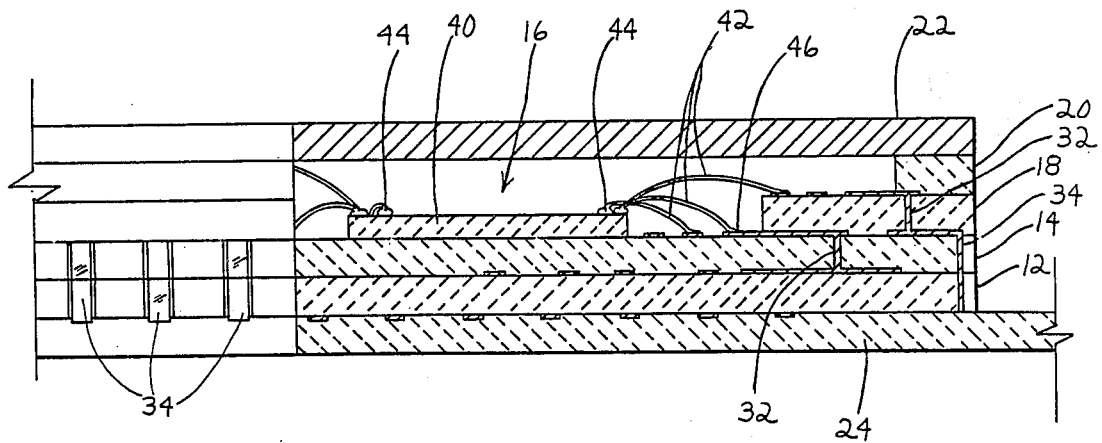
FIG. 3 is a section view taken on Line 3—3 of FIG. 2 showing the metalized edges, tunnels, and wire bond-pattern connections between the chip array and the various levels of the multi-layer ceramic package.

The conductive patterns are communicated one layer with the next, in one instance through "tunnels" 32 (FIG. 3) which are in the form of vertical through openings filled with metalization, and which connect the conductive patterns of one layer to the next. In another form the conductive patterns of the respective lamina are connected through edge metalizations 34 (FIG. 3).

The interconnected chip array 16 consists of component LSI chips which are connected together. The chips are connected by metalization printed circuits constructed on the confronting surface of intermediate layer 14, and indicated by reference numeral 36.

Between the chips, and to obviate the necessity for the wire bondings to be connected from a chip first outwardly to the periphery of the package and then back to another chip, there can be chip-to-chip wire bonding through lands 38 disposed between and separating the chips 40. These wire bonds are designated generally by reference numeral 42. There is thus, the interconnections necessary to form a high density interconnected chip array which has pin out connections to the conductive patterns at the respective laminations of the multi-layer ceramic package.

Figure 2:
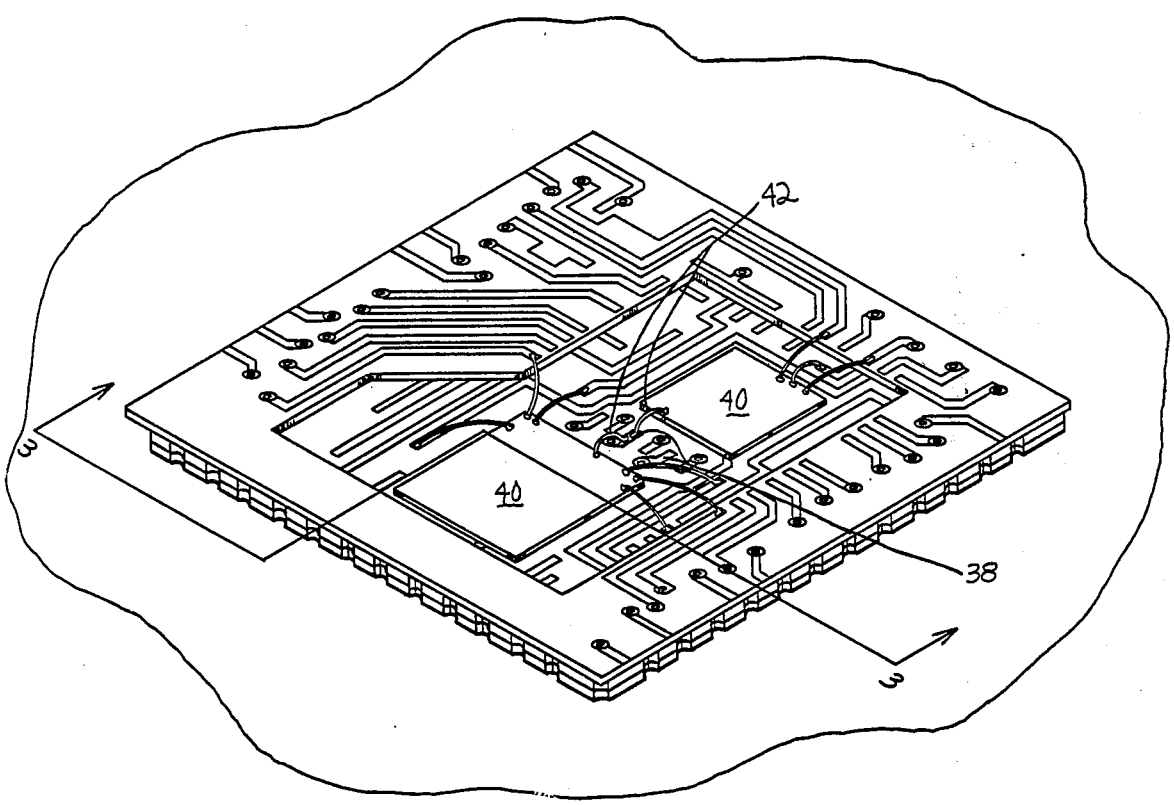
FIG. 2 is an isometric detail view of a multi-layer ceramic package with the ring and cover removed.
Figure 5:
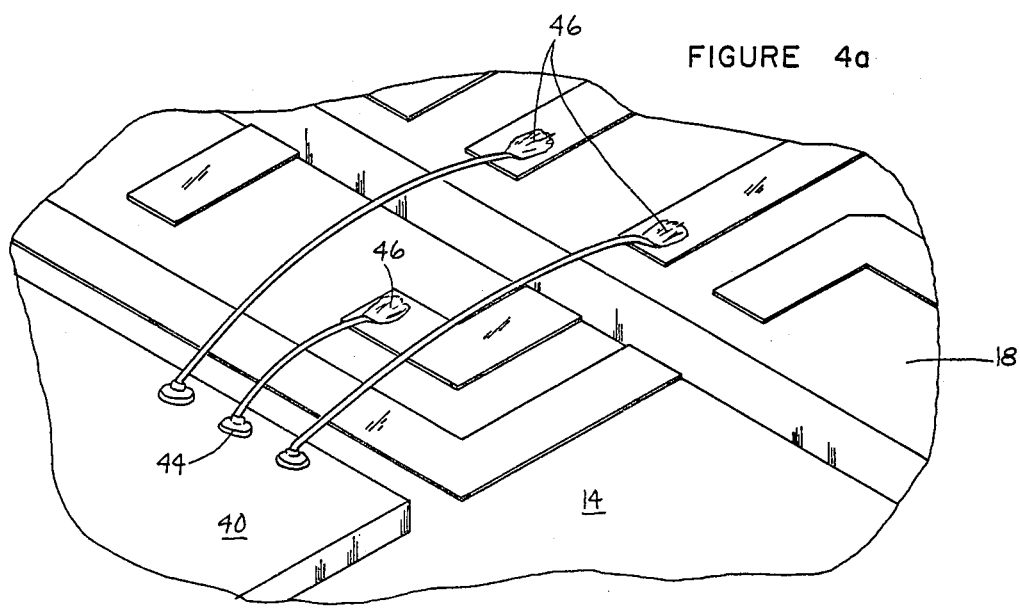

With the high component density described, it is difficult to maintain 10 mil spacing which is required for conductive patterns. This is achieved in the present invention, in the manner illustrated in FIGS. 2 and 3. As shown in FIGS. 2 and 3, the wire bonds converge upon the chip array connected at one end through a ball bond 44 (FIG. 5) to a chip 40 and at the other end through a wedge bond 46 to a conductive pattern on one or the other of the intermediate layer 14 or frame layer 18. In spite of the high density of LSI chip components and wire bonds, the 10 mil spacing of the conductive patterns is nontheless maintained by alternating between layers 14 and 18.

Obviously, there can more than two alternating layers; three, four, or even more layers for alternate wire bonding are contemplated. But the idea, generally, is that by coupling the wire bonds between the centrally disposed high density chip array, and alternately different levels of the metalized layers, it is possible to increase the number of wire bonds and thus achieve the desired centrally disposed component density while in no way compromising the necessary 10 mil spacing for the conductive patterns.

METHOD OF MANUFACTURE AND OPERATION

Figure 4A:
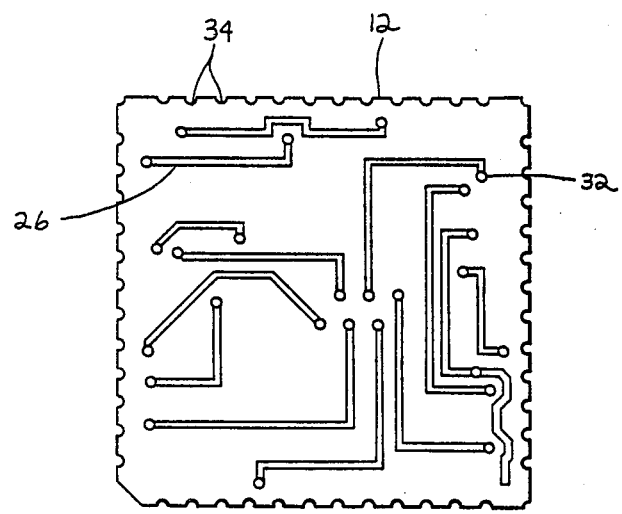
FIG. 4A is the upper surface of the base layer of the ceramic package and is the opposite face to that of FIG. 4; and, FIG. 5 is an enlarged detail view of the ball bond and wedge bond leads to the wire between the chip array at one wire end and a respective layer of the ceramic package at the other wire end.

The wire bonds between the central array and the conductive patterns at the various levels, make appropriate connections from layer-to-layer as described, either through tunnels 32 or edge metalizations 34 (FIGS. 3 and 4a) all of which ultimately lead to the base layer 12 and underlying pads 33 which are then bonded to appropriate locations on an underlying metalized board 24. The laminas may typically consist of aluminum silicate or other inert substrate materials, which, as stated previously, are green at the time the metalizations, tunnel, and edge metalizations are formed thereon. Then the green laminas are fired to hermetically seal the laminas together to produce a monolithic ceramic package.

The layers having a conductive pattern, the ring 20, and the chip array, once the chip array is fixed and wire bondings made with the centrally disposed array, are surmounted with cover layer 22. The package as a whole is next fired (sealed) and the final product mounted onto the metalized board 24.

The chip array is mounted on the intermediate layer 14, and the chips 40 of the array are communicated chip-to-chip through lands 38 on the upper face of the intermediate layer 14, and other layers as required.

The chip array has wire bond connections 42 to the metalized ceramic conductor patterns, by bonding the ends of the wire bonds so that adjacent wire bonds are connected from the chip array to alternating levels in the multi-layer ceramic package.

The package as a whole, is next mounted on metalized board 24 so that the pads 33 at the exterior surface of the package are mounted on various terminals of the metalized board having a predetermined printed circuit architecture and componentry.

It should be understood that any conductive pattern can be screened onto the surface of the respective layers of the multi-layer ceramic package, and the conductive patterns as such, i.e. the particular architecture or pattern per se, does not form a part of the present invention.

It should be further emphasized that the 10 mil spacing is achievable in the present invention by reason of connecting first one wire from the chip array to a first level and then alternating the wire bonds to a second level, a third level, a fourth level, etc. thereby providing the means for maintaining a 10 mil of conductive patterns spacing in spite of the increased component density and the central converging of such wires. Quite obviously, if the 10 mil spacing is not maintained as an industry standard, it is equally possible to obtain an even higher component density with either an agreed upon less than 10 mil spacing and/or less than 10 mil bonding lands.

In all events, the present invention provides a possibility of maximum component density while maintaining a 10 mil spacing, but is equally applicable to whatever component density is desired, while achieving an inherently greater density for the respective wire bonds.

Although the present invention has been illustrated and described in connection with a single example embodiment, it will be understood that this is illustrative of the invention and is by no means restrictive thereof. For example, instead of three ceramic layers of the multi-layer ceramic package, it is possible to use four, five, or any number desired to achieve the desired combination of wire spacing, multi-layering, and various arrangements for the printed circuit network as well as the architecture of interconnected chip array. All of these changes are contemplated as part of the present invention and it is intended that such variation shall be included within the scope of the following claims as equivalents of the invention.

What is claimed as new and desired to be secured by Letters Patent of the United States is:

1. In a process for producing a high component density multi-layer monolithic LSI ceramic package, comprising the steps of forming metalized conductor patterns on the surfaces of a plurality of laminas, bonding together the plurality of laminas including a lamina adapted to receive individual chips of a chip array, disposing at least one chip on said lamina, the conductive patterns disposed on respective ones of said laminas with the ends of the conductive patterns spaced at least 10 mil apart and the conductive pattern ends of one lamina disposed in alternating relationship relative to the ends located on an adjacent lamina, selected laminas having metallized conductive means comprising metalized-filled openings forming conductive paths between conductive patterns on selected ones of the laminas forming the ceramic package and edge-formed metalized conductive paths interconnecting conductive patterns on the multi-layer ceramic laminas, forming wire bonds on selected ones of said conductive pattern ends, and forming alternating wire connections from said chip to said wire bonds so that said wire connections maintain the not less than 10 mil spacing of said wire bonds respectively by extending between said chip at one end to wire bonds of selected ones of the alternative conductive pattern ends of the adjacent levels of laminas at the other end to provide electrical connections from the chip to said conductive patterns, whereby a high component density chip array may be mounted in said LSI ceramic package.

2. The method in accordance with claim 1, including the steps of forming said multi-layers of individually compacted ceramic particles, and simultaneously firing said compacted ceramic layers to sinter the particles and to bond the respective layers together.

3. The process in accordance with claim 1, including the step of disposing a ring and cover at the upper end of said multi-layers, and providing a plurality of pads at the outer face of said multi-layer carrier and adapted to serve as outlets on a metalized board.

4. The process in accordance with claim 1, including the steps of forming a plurality of lands on the layer adapted for receiving chips and effecting short wire bonding between respective chips through said lands.

5. The process in accordance with claim 1, including the step of sealing an interior cavity of said carrier which receives said chip and wherein said chip is mounted.

6. The process in accordance with claim 1, including the step of disposing said wire connections between the chip and metalized paths of said layers and in alternating multi-level connections between said chip and layers to not less than two alternating layers of said multi-layer chip carrier.

\* \* \* \* \*